US012699210B2

(12) United States Patent
Nominanda et al.

(10) Patent No.: US 12,699,210 B2
(45) Date of Patent: Aug. 4, 2026

(54) METHODS OF FORMING COVER LENS STRUCTURES FOR DISPLAY DEVICES, AND RELATED APPARATUS AND DEVICES

(71) Applicant: Applied Materials, Inc., Santa Clara, CA (US)

(72) Inventors: Helinda Nominanda, San Jose, CA (US); Tae Kyung Won, San Jose, CA (US); Han Nguyen, San Jose, CA (US); Seong Ho Yoo, San Ramon, CA (US); Soo Young Choi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 516 days.

(21) Appl. No.: 17/864,193

(22) Filed: Jul. 13, 2022

(65) Prior Publication Data

US 2024/0019606 A1 Jan. 18, 2024

Related U.S. Application Data

(60) Provisional application No. 63/325,473, filed on Mar. 30, 2022.

(51) Int. Cl.
*C23C 16/02* (2006.01)
*C23C 14/02* (2006.01)
(Continued)

(52) U.S. Cl.
CPC .............. *G02B 1/14* (2015.01); *C23C 14/024* (2013.01); *C23C 14/06* (2013.01); *C23C 16/0272* (2013.01); *G02B 1/11* (2013.01)

(58) Field of Classification Search
CPC .... C23C 14/024; C23C 14/06; C23C 16/0272
See application file for complete search history.

(56) References Cited

U.S. PATENT DOCUMENTS 6,083,313 A * 7/2000 Venkatraman ........... C08J 7/048
428/447
6,593,247 B1 * 7/2003 Huang .................. C23C 16/045
438/758

(Continued)

FOREIGN PATENT DOCUMENTS

CN 1950723 A 4/2007
CN 102686527 A 9/2012
(Continued)

OTHER PUBLICATIONS

Thermal Analysis Lab. Glass Transition Temperature of PET. May 30, 2016. CTHERM. https://ctherm.com/resources/newsroom/thermal-analysis-labs/determining-glass-transition-temperature-of-pet/ (Year: 2016).*

(Continued)

*Primary Examiner* — Dah-Wei D. Yuan
*Assistant Examiner* — Kristen A Dagenais
(74) *Attorney, Agent, or Firm* — Patterson + Sheridan, LLP

(57) ABSTRACT

Implementations of the present disclosure relate to methods, and related apparatus and devices, of forming flexible cover lens structures for flexible or foldable display devices. In one or more implementations, one or more adhesion promotion layers are deposited above at least one wet hardcoat layer of a substrate structure. A dry hardcoat layer is deposited above the one or more adhesion promotion layers using a dry deposition process that includes plasma enhanced chemical vapor deposition (PECVD). An anti-smudge layer is deposited above the dry hardcoat layer. Each of the one or more adhesion promotion layers, the dry hardcoat layer, and the anti-smudge layer is deposited at a process temperature that is less than 80 degrees Celsius.

20 Claims, 4 Drawing Sheets

(51) Int. Cl.

| | |
|---|---|
| *C23C 14/06* | (2006.01) |
| *G02B 1/11* | (2015.01) |
| *G02B 1/14* | (2015.01) |

(56) References Cited

U.S. PATENT DOCUMENTS

| | | | |
|---|---|---|---|
| 7,038,195 B2 | 5/2006 | Kida et al. | |
| 7,432,184 B2 * | 10/2008 | Hosokawa | H10P 72/0466 |
| | | | 257/E21.414 |
| 8,553,333 B2 | 10/2013 | Chang et al. | |
| 10,214,816 B2 | 2/2019 | Haverkamp et al. | |
| 10,294,387 B2 | 5/2019 | Kang et al. | |
| 11,345,135 B2 | 5/2022 | Wang | |
| 2002/0122925 A1 | 9/2002 | Liu et al. | |
| 2005/0249944 A1 | 11/2005 | Wang et al. | |
| 2007/0196633 A1 | 8/2007 | Coak et al. | |
| 2008/0047468 A1 | 2/2008 | de Rojas | |
| 2011/0097551 A1 | 4/2011 | Pischow et al. | |
| 2013/0316182 A1 | 11/2013 | Mori | |
| 2014/0322472 A1 | 10/2014 | McCormick et al. | |
| 2015/0125679 A1 | 5/2015 | Ishikawa | |
| 2016/0372701 A1 | 12/2016 | Kwon et al. | |
| 2017/0069493 A1 * | 3/2017 | Sheng | C23C 16/52 |
| 2017/0095993 A1 | 4/2017 | Tomomatsu et al. | |
| 2017/0170416 A1 | 6/2017 | Johnson et al. | |
| 2017/0276840 A1 | 9/2017 | Horio et al. | |
| 2018/0196169 A1 | 7/2018 | Choi et al. | |
| 2018/0202046 A1 | 7/2018 | Savas et al. | |
| 2018/0265731 A1 | 9/2018 | Ekinaka et al. | |
| 2018/0294441 A1 | 10/2018 | Brotzman et al. | |
| 2018/0372921 A1 | 12/2018 | Washio et al. | |
| 2019/0315105 A1 | 10/2019 | Isojima et al. | |
| 2019/0383973 A1 | 12/2019 | Jang et al. | |
| 2020/0057178 A1 | 2/2020 | Thothadri et al. | |
| 2020/0243798 A1 | 7/2020 | Matsushita et al. | |
| 2020/0410208 A1 * | 12/2020 | Thothadri | G02B 1/11 |

FOREIGN PATENT DOCUMENTS

| | | | |
|---|---|---|---|
| CN | 104284776 B | 1/2016 |
| CN | 107305756 A | 10/2017 |
| CN | 107919436 A | 4/2018 |
| CN | 105122094 B | 6/2018 |
| EP | 1632541 A1 | 3/2006 |
| EP | 2329888 A2 | 6/2011 |
| JP | 2008275737 A | 11/2008 |
| JP | 2010524716 A | 7/2010 |
| JP | 4686426 B2 | 5/2011 |
| JP | 2013107382 A | 6/2013 |
| TW | I669294 B | 8/2019 |
| WO | 2008124559 A2 | 10/2008 |
| WO | 2012090665 A1 | 7/2012 |
| WO | 2012136529 A1 | 10/2012 |
| WO | 2017051914 A1 | 3/2017 |
| WO | 2017073903 A1 | 5/2017 |
| WO | 2018130289 A1 | 7/2018 |
| WO | 2020263631 A1 | 12/2020 |
| WO | 2020263632 A1 | 12/2020 |

OTHER PUBLICATIONS

International Search Report and the Written Opinion for International Application No. PCT/US2019/040402 mailed Oct. 18, 2019.
Taiwanese Office Action and Search Report for TW Application No. 108123820 dated Jul. 30, 2020.
Japanese Office Action dated Apr. 19, 2022 in Application No. 2021-504252.
Japanese Office Action dated Aug. 9, 2022 in Application No. 2021-504252.
Japanese Office Action dated Dec. 13, 2022 in Application No. 2021-504252.
Chinese Office Action and Search Report dated Aug. 31, 2022 in Application No. 201980055267.1.
Chinese Office Action dated Dec. 22, 2022 in Application No. 201980055267.
Non-Final Office Action dated Sep. 9, 2020 for U.S. Appl. No. 16/505,627.
Final Office Action dated Jan. 22, 2021 for U.S. Appl. No. 16/505,627.
Day-Shan Liu et al: "Adhesion enhancement of hard coatings deposited on flexible plastic substrates using an interfacial buffer layer", Journal of Physics D: Applied Physics, Institute of Physics Publishing Ltd, GB, vol. 43, No. 17, Apr. 15, 2010, p. 175301, ISSN: 0022-3727.
Kuhr M et al: "Coatings on plastics with the PICVD technology", Thin Solid F, Elsevier, Amsterdam, NL, vol. 442, No. 1-2, 2003, pp. 107-116, ISSN: 0040-6090, DOI: 10.1016/S0040-6090(03)00956-8.
International Search Report and Written Opinion dated Jul. 7, 2023 for Application No. PCT/US2023/016099.
International Search Report and Written Opinion dated Jul. 17, 2023 for Application No. PCT/US2023/016261.

* cited by examiner

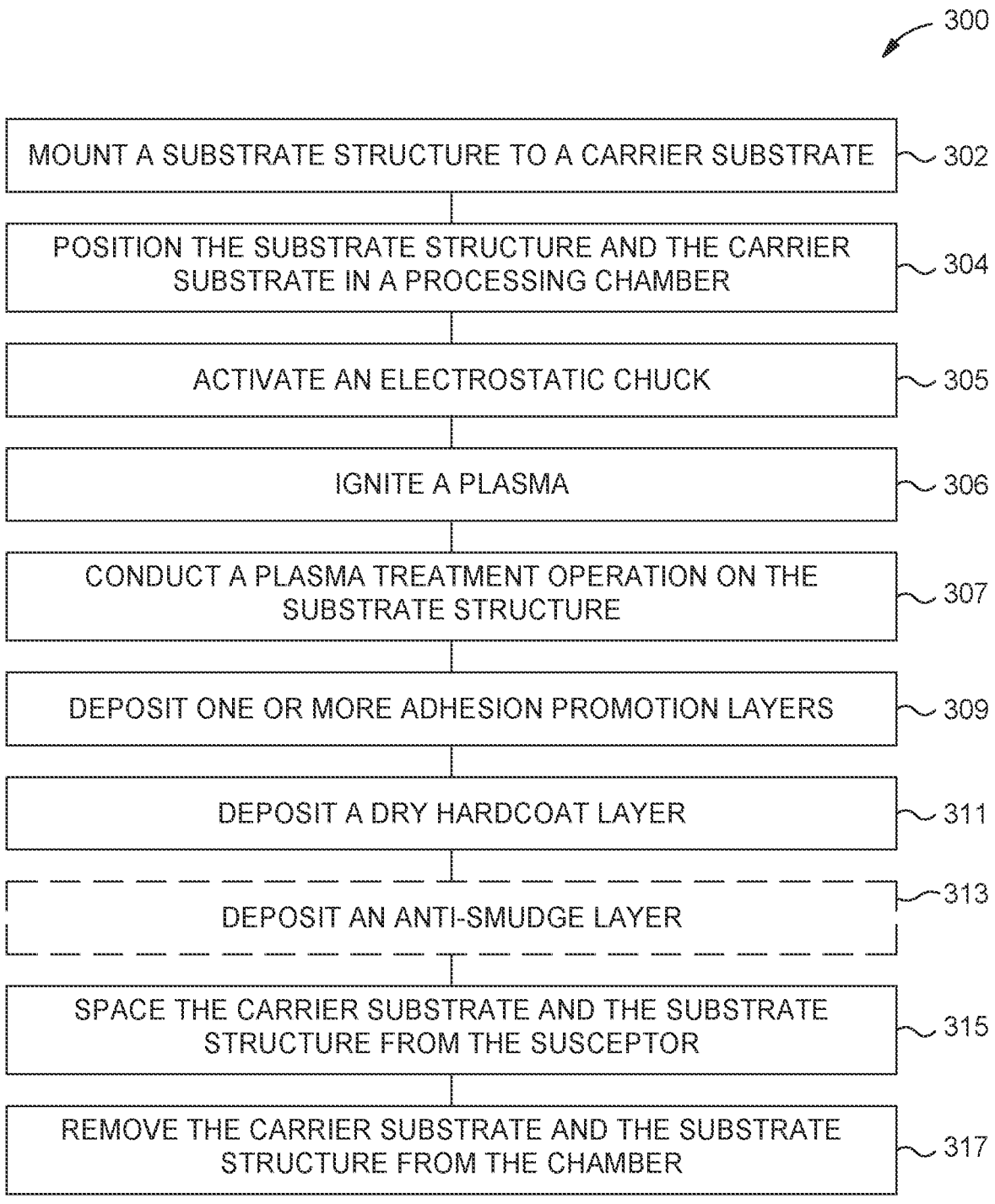

300

| MOUNT A SUBSTRATE STRUCTURE TO A CARRIER SUBSTRATE | ~ 302 |

| POSITION THE SUBSTRATE STRUCTURE AND THE CARRIER SUBSTRATE IN A PROCESSING CHAMBER | ~ 304 |

| ACTIVATE AN ELECTROSTATIC CHUCK | ~ 305 |

| IGNITE A PLASMA | ~ 306 |

| CONDUCT A PLASMA TREATMENT OPERATION ON THE SUBSTRATE STRUCTURE | ~ 307 |

| DEPOSIT ONE OR MORE ADHESION PROMOTION LAYERS | ~ 309 |

| DEPOSIT A DRY HARDCOAT LAYER | ~ 311 |

| DEPOSIT AN ANTI-SMUDGE LAYER | ~313 |

| SPACE THE CARRIER SUBSTRATE AND THE SUBSTRATE STRUCTURE FROM THE SUSCEPTOR | ~ 315 |

| REMOVE THE CARRIER SUBSTRATE AND THE SUBSTRATE STRUCTURE FROM THE CHAMBER | ~ 317 |

FIG. 3

METHODS OF FORMING COVER LENS STRUCTURES FOR DISPLAY DEVICES, AND RELATED APPARATUS AND DEVICES

CROSS-REFERENCE TO RELATED APPLICATION

This application claims the benefit of U.S. provisional patent application Ser. No. 63/325,473, filed Mar. 30, 2022, which is herein incorporated by reference in its entirety.

BACKGROUND

Field

Implementations described herein generally relate to flexible or foldable display devices, and more specifically to flexible or foldable cover lens.

Description of the Related Art

Electronic devices often have displays such as liquid crystal displays (LCDs), organic light emitting-diode (OLED) displays, and quantum dot (QD) displays. Such displays can be fragile and sensitive to moisture, pressure, or particle contamination. Generally, display devices use several layers of optical devices to colorize, polarize, and shutter light from an illumination source. To prevent damage to the underlying film, a rigid display cover lens layer is mounted over the other layers to prevent damage to the underlying layers. The inclusion of the rigid display cover lens can add undesirable weight to an electronic device. Cover lenses can also be hindered with respect to optical performance (e.g., light transmission and hazing), flexibility (e.g., cracking or plastically deforming at critical strains), and/or mechanical properties (such as hardness and impact resistance). For example, certain cover lenses can be susceptible to temperatures, and can exhibit increased particle migration and/or increased hazing. Replacing cover lenses can involve expertise, time, and great expense.

Therefore, there is a need for improved display cover lenses that have one or more of: reduced hazing, mitigated oligomer migration, high hardness, high optical transmission, high elasticity, beneficial mechanical properties, and/or anti-abrasion properties for flexible or foldable displays.

SUMMARY

Implementations of the present disclosure relate to methods, and related apparatus and devices, of forming flexible cover lens structures for flexible or foldable display devices. The display devices can include OLED displays or LCD displays, for example.

In one implementation, a method of forming a cover lens structure includes positioning a substrate structure and a carrier substrate in a processing chamber. The substrate structure is mounted to the carrier substrate, and the substrate structure includes a substrate and one or more wet hardcoat layers. The method includes depositing one or more adhesion promotion layers above at least one of the one or more wet hardcoat layers. The method includes depositing a dry hardcoat layer above the one or more adhesion promotion layers using a dry deposition process that includes plasma enhanced chemical vapor deposition (PECVD), and depositing an anti-smudge layer above the dry hardcoat layer. Each of the one or more adhesion promotion layers, the dry hardcoat layer, and the anti-smudge layer is deposited at a process temperature that is less than 80 degrees Celsius.

In one implementation, a non-transitory computer readable medium comprising instructions that, when executed by a processor, cause the following operations to be conducted. The operations include positioning a substrate structure and a carrier substrate in a processing chamber. The substrate structure is mounted to the carrier substrate, and the substrate structure includes a substrate and one or more wet hardcoat layers. The operations includes depositing one or more adhesion promotion layers above at least one of the one or more wet hardcoat layers. The operations includes depositing a dry hardcoat layer above the one or more adhesion promotion layers using a dry deposition process that includes plasma enhanced chemical vapor deposition (PECVD), and depositing an anti-smudge layer above the dry hardcoat layer. The instructions cause each of the one or more adhesion promotion layers, the dry hardcoat layer, and the anti-smudge layer to be deposited at a process temperature that is less than 80 degrees Celsius.

In one implementation, a cover lens structure for display devices includes a carrier substrate formed of glass, and a substrate structure mounted to the carrier substrate. The substrate structure includes a substrate and one or more wet hardcoat layers. The cover lens structure includes one or more adhesion promotion layers formed above at least one of the one or more wet hardcoat layers, a dry hardcoat layer formed above the one or more adhesion promotion layers, and an anti-smudge layer formed above the dry hardcoat layer. The substrate is formed of one or more polymeric materials.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of scope, for the disclosure may admit to other equally effective implementations.

FIG. 3 is a schematic block diagram view of a method of forming a cover lens structure, according to one implementation.

Figure 1:
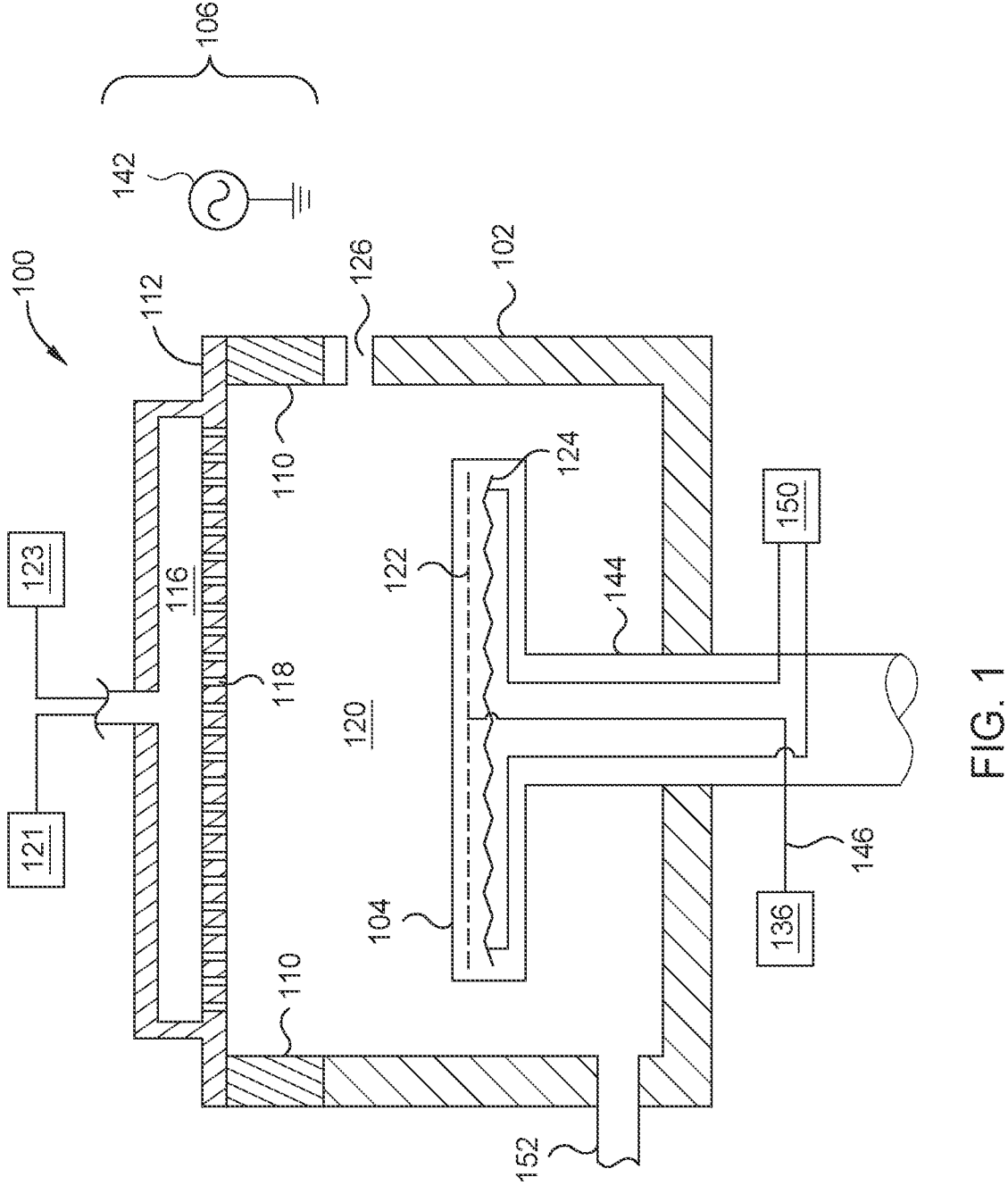
FIG. 1 depicts a schematic cross-sectional side view of a processing chamber, according to one or more implementations described herein.

To facilitate understanding, identical reference numerals have been used, where possible, to designate identical elements that are common to the Figures. It is contemplated that elements and features of one implementation may be beneficially incorporated in other implementations without further recitation.

DETAILED DESCRIPTION

Implementations of the present disclosure relate to methods, and related apparatus and devices, of forming flexible cover lens structures for flexible or foldable display devices. The display devices can include OLED displays or LCD displays, for example.

FIG. 1 depicts a schematic cross-sectional side view of a processing chamber 100, according to one or more implementations described herein. In the implementation shown, the processing chamber 100 is a plasma-enhanced chemical vapor deposition (PECVD) chamber using a radio-frequency (RF) capacitively coupled processing plasma.

The processing chamber 100 includes a chamber body 102, a substrate support 104 disposed inside the chamber body 102, and a lid assembly 106 coupled to the chamber body 102 and enclosing the substrate support 104 in a processing volume 120. Substrates are provided to the processing volume 120 through an opening 126, which may be sealed for processing using a door. An isolator 110, which may be a dielectric material such as a ceramic or metal oxide, for example aluminum oxide and/or aluminum nitride, separates the chamber body 102 electrically and thermally from a gas distributor 112. The gas distributor 112 features openings 118 for admitting process gas into the processing volume 120. The gas distributor 112 may be coupled to a source of electric power 142, such as an RF generator. DC power, pulsed DC power, and pulsed RF power may also be used.

The gas distributor 112 may be a conductive gas distributor or a non-conductive gas distributor. The gas distributor 112 may also be made of conductive and non-conductive components. For example, a body of the gas distributor 112 may be conductive while a face plate of the gas distributor 112 is non-conductive. In a plasma processing chamber, the gas distributor 112 may be powered, as shown in FIG. 1, or the gas distributor 112 may be coupled to ground.

An electrode 122 is coupled to and/or disposed in the substrate support 104. The electrode 122 may be embedded within the substrate support 104 or coupled to a surface of the substrate support 104. The electrode 122 may be a plate, a perforated plate, a mesh, a wire screen, or any other distributed arrangement. The electrode 122 may be coupled to an electric power source 136 by a conduit 146.

A second electrode 124, which may be a bias electrode and/or an electrostatic chucking electrode, may be coupled to and/or disposed in the substrate support 104. The second electrode 124 may be coupled to a second electric power source 150. The second electric power source 150 may supply DC power, pulsed DC power, RF power, pulsed RF power, or any combination thereof.

In operation, a substrate is disposed on the substrate support 104, and one or more process gases are flowed through the lid assembly 106 using an inlet 114 according to any desired flow plan. The one or more process gases are supplied to the processing volume 120 using one or more process gas sources 121. Gases exit the processing chamber 100 through an outlet 152. Electric power is coupled to the gas distributor 112 to establish a plasma in the processing volume 120 (e.g., in-situ processing plasma). The substrate may be subjected to an electrical bias (e.g., chucked) using the second electrode 124. After the substrate is removed from the processing chamber 100, a cleaning plasma having one or more cleaning gases is supplied to the processing chamber 100 using a remote plasma source (RPS) 123. The cleaning plasma cleans interior surfaces of the processing chamber 100. The cleaning plasma can be supplied through the inlet 114, or through a second inlet of the lid assembly 106. The cleaning plasma can be supplied through a sidewall of the chamber body 102.

A controller 190 is coupled to the processing chamber 100. The controller 190, such as a programmable computer, is adapted to control the processing chamber 100. The controller 190 includes a programmable central processing unit (CPU) 191 which is operable with a memory 192 (e.g., non-volatile memory) and support circuits 193. The support circuits 193 are coupled to the CPU 191 and include cache, clock circuits, input/output circuitry and subsystems, power supplies, and the like, and combinations thereof coupled to the various components of the processing chamber 100.

In one or more embodiments, the CPU 191 is one of any form of general purpose computer processor used in an industrial setting, such as a programmable logic controller (PLC), for controlling various monitoring system component and sub-processors. The memory 192, coupled to the CPU 191, is non-transitory and is typically one or more of readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk drive, hard disk, flash drive, or any other form of digital storage, local or remote.

Herein, the memory 192 is in the form of a computer-readable storage media containing instructions (e.g., non-volatile memory), that when executed by the CPU 191, facilitates the operation of the processing chamber 100. The instructions in the memory 111 are in the form of a program product such as a program that implements the methods of the present disclosure (e.g., middleware application, equipment software application, etc.). The program code may conform to any one of a number of different programming languages. In one example, the disclosure may be implemented as a program product stored on computer-readable storage media for use with a computer system. The program(s) of the program product define functions and operations of the embodiments (including the methods, such as the method 300, described herein). In one or more embodiments, the instructions (when executed by the CPU 191) cause one or more of the operations of the method 300 to be conducted.

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions and operations of the methods described herein, are embodiments of the present disclosure.

Figure 2:
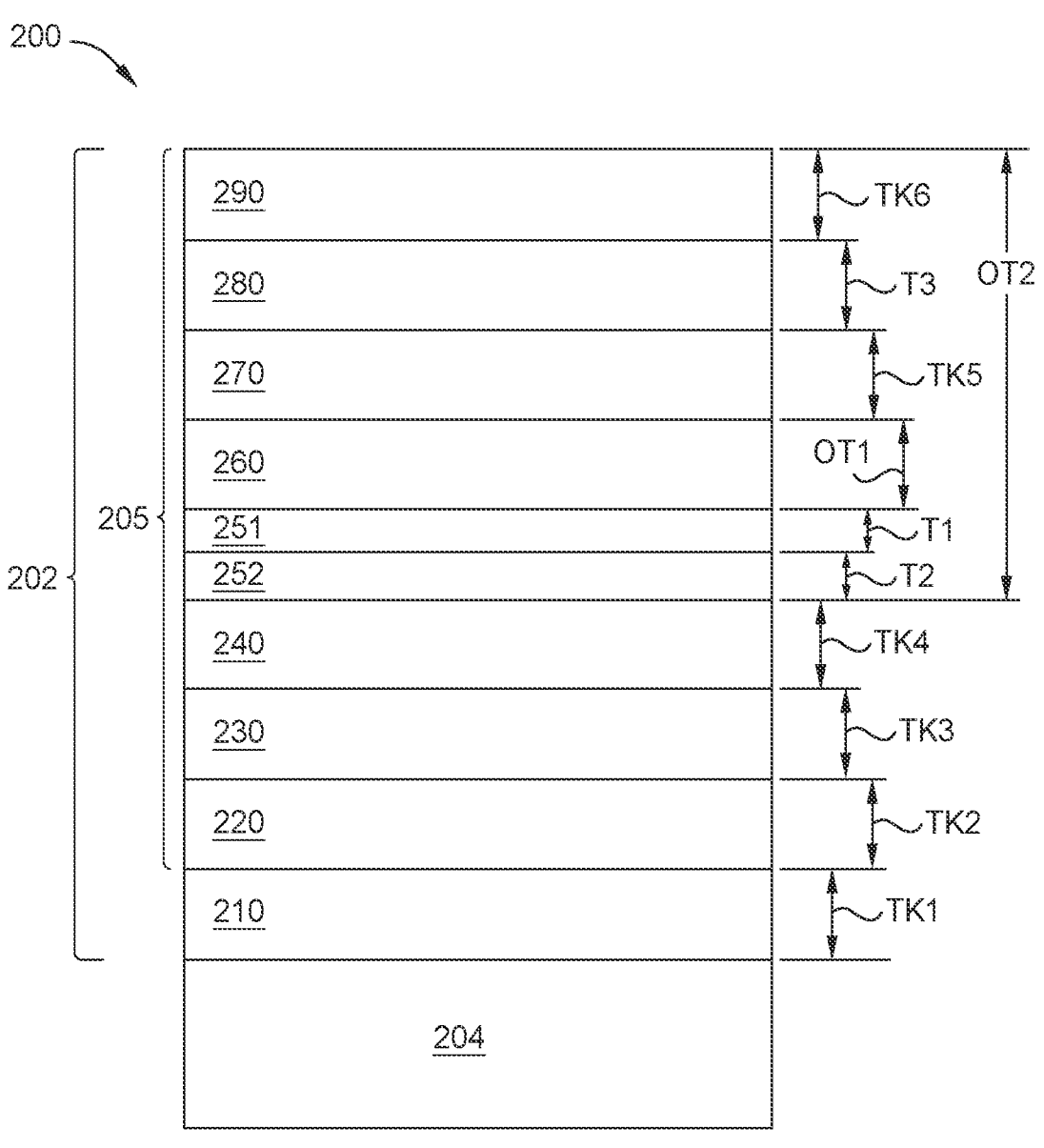
FIG. 2 depicts a schematic, cross-sectional view of a display device that includes a substrate structure mounted to a carrier substrate, according to one or more implementations described herein.

FIG. 2 depicts a schematic, cross-sectional view of a display device 200 that includes a substrate structure 205 mounted to a carrier substrate 210, according to one or more implementations described herein. The display device 200 can be similar to one or more of the display devices described herein.

The substrate structure 205 and the carrier substrate 210 are part of a cover lens structure 202 that is disposed on a flexible display structure or flexible display stack (FDS) 204. The cover lens structure 202 is flexible. The carrier substrate 210 is formed of glass.

The substrate structure 205 includes an impact absorption layer (IAL) 220 disposed on the carrier substrate 210, a moisture barrier layer 230 disposed on the impact absorption layer 220, and a substrate 240 disposed on the moisture barrier layer 230. The substrate structure 2602 includes one or more wet hardcoat layers 251, 252 disposed on the substrate 240, and one or more adhesion promotion layers (APL) 260 disposed on the one or more wet hardcoat layers 251, 252. The substrate structure 205 includes an anti-reflectance (ARF) layer 270 disposed on the one or more adhesion promotion layers 260, a dry hardcoat (HC) layer 280 disposed on the anti-reflectance layer 270, and an anti-smudge layer 290 disposed on the dry hardcoat layer 280. In one embodiment, which can be combined with other embodiments, each of the one or more wet hardcoat layers 251, 252 can have a pencil hardness in a range from about 2H to about 9H, a nano-indentation hardness in a range from about GPa to about 1.5 GPa, and/or a porosity of about 6% to about 10%. In one embodiment, which can be combined with other embodiments, the dry hardcoat layer 280 can have a pencil hardness in a range from about 2H to about 9H, a nano-indentation hardness in a range from about 1 GPa to about 5 GPa, and/or a porosity of about 1% to about 7%.

The present disclosure contemplates other configurations for the layers of the cover lens structure 202, in addition to what is shown in FIG. 2. As an example, it is contemplated that certain layers on either side of the substrate 240 can be omitted and/or duplicated. For example, the substrate structure 2602 on either side of the substrate 240 can have one or more additional layers and/or one or more less layers.

As another example, the carrier substrate 210 can be omitted and/or the moisture barrier layer 230 can be positioned between the impact absorption layer 220 and the FDS 204. As another example, the carrier substrate 210 and/or the one or more wet hardcoat layers 251, 252 can be omitted. As another example, the carrier substrate 210 and/or the impact absorption layer 220 can be omitted. As another example, the moisture barrier layer 230 can be omitted such that the impact absorption layer 220 is positioned between the substrate 240 and the carrier substrate 210. As another example, the moisture barrier layer 230 can be omitted and/or the impact absorption layer 220 can be positioned between the carrier substrate 210 and the FDS 204. As another example, the moisture barrier layer 230 and/or the one or more wet hardcoat layers 251, 252 can be omitted. As another example, the carrier substrate 210 and/or the moisture barrier layer 230 can be omitted.

As another example, one or more of the carrier substrate 210, the impact absorption layer 220, the moisture barrier layer 230, the substrate 240, the one or more wet hardcoat layers 251, 252, the ARF layer 270, and/or the dry hardcoat layer 280 can be omitted. As another example, the dry hardcoat layer 280 can be omitted, and/or the APL 260 can be positioned between the ARF layer 270 and the anti-smudge layer 290. As another example, two adhesion promotion layers 260 can be included, with an adhesion promotion layer 260 on both sides of the one or more wet hardcoat layers 251, 252. The two adhesion promotion layers 260 can independently be different from one another, or identical to each other.

Flexible Display Structure (FDS) and Carrier Substrate

The FDS 204 is a flexible display structure or flexible display stack which can be or include one or more light emitting diode (LED) displays, one or more organic light emitting diode (OLED) displays, one or more liquid crystal displays (LCDs), one or more quantum dot (QD) displays, as well as other types of displays. The FDS 204 can be or include one or more flexible displays and/or one or more rigid displays. The FDS 204 can be or include other types of devices and can be contained within or a part of a monitor, a display, a screen, a television, a phone (e.g., mobile phone, smart phone, or cellular phone), a computer or laptop, a tablet, a watch, or other electronic device. In one or more embodiments, the FDS 204 include a foldable screen or foldable display on a foldable or flip phone. In one or more embodiments, the FDS 204 include a foldable screen or foldable display on a foldable laptop computer or foldable tablet.

The FDS 204 can have a display glass layer as an upper surface. In one or more examples, the FDS 204 does not have a display glass layer as the upper surface but instead includes the carrier substrate 210. In one or more examples, the FDS 204 does have a display glass layer (not shown) as the upper surface and the carrier substrate 210 is omitted in the cover lens structure 202 or other cover lens structures described herein. In one or more examples, the FDS 204 does have a display glass layer (not shown) as the upper surface and the carrier substrate 210 is disposed on the display glass layer of the FDS 204 in the cover lens structure 202 or other cover lens structures described herein.

The carrier substrate 210 is or includes one or more layers containing glass which are optically clear or transparent. In one or more examples, the carrier substrate 210 includes one or more ultra-thin glass layers. The carrier substrate 210 has a thickness TK1 within a range of about 5 microns to about 200 microns, or higher.

Impact Adsorption Layer (IAL)

The impact absorption layer 220 can be or include one or more layers which are bendable, flexible, and/or foldable and used to absorb shock or impact. The impact absorption layer 220 contains one or more materials which can be or include ether urethane, ester urethane, aliphatic urethane, aliphatic polyurethane, aliphatic polyester urethane, polysulfide thermoset, poly amide, copolymers thereof, elastomers thereof, or any combination thereof. In some examples, the impact absorption layer 220 can be deposited or otherwise formed by solution processing and include using operations such as bar-coater operations, slot-die operations, or other methods. In one or more embodiments, the impact absorption layer 220 can be formed, treated, and/or otherwise processed on a sheet-to-sheet processing system and/or a roll-to-roll processing system. For example, the impact absorption layer 220 can be deposited, coated, or otherwise formed on an underlying surface, layer, or device by one or more sheet-to-sheet and/or roll-to-roll process operations.

The impact absorption layer 220 has an optical transmission in the visible range within a range of about 82% to about 99%, such as 88% or higher, 90% or higher, or 92% or higher. The impact absorption layer 220 has a thickness TK2 within a range of about 0.5 microns to about 200 microns, or greater. In one or more embodiments, the impact absorption layer 220 includes an elastomer layer having a thickness of less than 100 microns, such as about 75 microns or less. In one or more examples, the impact absorption layer 220 can be slot die coated or cast.

Moisture Barrier Layer (MBL)

The moisture barrier layer 230 can be one or more films, coatings, or other layers which have intrinsic moisture or water barrier properties and are bendable, flexible, and/or foldable. In one or more embodiments, the moisture barrier layer 230 contains one or more one or more layers, such as a moisture and/or water vapor barrier layer, a high surface energy layer (e.g., having hydrophilic properties), a planarization layer, an encapsulation layer, portions of layers thereof, or any combination thereof. In one or more embodiments, the moisture barrier layer 230 contains one or more materials which can be or include silicon oxide, silicon nitride, silicon oxynitride, a dopant thereof, or any combination thereof.

In one or more embodiments, the moisture barrier layer 230 has a single layer. In one or more embodiments, the moisture barrier layer 230 includes multiples layers, such as 2-9 sublayers, or more sublayers. For example, the moisture barrier layer 230 can include a plurality of sublayers contained therein, such as from about 2 sublayers to about 5 sublayers. In one or more examples, the moisture barrier layer 230 contains a film stack having three or more sublayers, such as a first sublayer, a second sublayer, and a third sublayer—where the second sublayer is disposed between the first and second sublayers. In one or more examples, the film stack is a SiN/SiO/SiN stack where the first sublayer can be or include silicon nitride, the second sublayer can be or include silicon oxide, and the third sublayer contains silicon nitride. The moisture barrier layer 230 is deposited or otherwise produced from one or more vapor deposition processes which can be or include physical vapor deposition (PVD), chemical vapor deposition (CVD), plasma-enhanced CVD (PECVD), high-density plasma CVD (HDP-CVD), atomic layer deposition (ALD), plasma-enhanced ALD (PE-ALD), thermal evaporation, electron beam evaporation, other vacuum or vapor deposition processes, or any combination thereof. In one or more embodiments, the moisture barrier layer 230 can be formed, treated, and/or otherwise processed on a sheet-to-sheet processing system and/or a roll-to-roll processing system. For example, the moisture barrier layer 230 can deposited, coated, or otherwise formed on an underlying surface, layer, or device by one or more sheet-to-sheet and/or roll-to-roll process operations.

The moisture barrier layer 230 has a thickness TK3 within a range of about nm to about 700 nm, or higher. The moisture barrier layer 230 has a water vapor transport rate (WVTR) within a range of about $1 \times 10^{-6}$ g/m²/day to about 10 g/m²/day, such as within a range of about $1 \times 10^{-6}$ g/m²/day to about 1 g/m²/day. The moisture barrier layer 230 has an optical transmission in the visible range within a range of about 82% to about 99%, such as 88% or higher, 90% or higher, or 92% or higher.

Substrate

The substrate 240 can be or include one or more flexible plastic or polymeric substrates. The substrate 240 can be transparent and/or colorless. The substrate 240 is formed of one or more polymeric materials. The substrate 240 contains one or more materials which can be or include one or more of polyethylene terephthalate(s) (PET), polyethylene naphthalate (PEN), triacetylcellulose(s), polycarbonate(s), polyimide(s) (PI), colorless polyimide(s) (CPI), polyamide(s), polysulfides, polymethacrylic acid methylester(s), polymethacrylic acid methylesther(s), polyether ether ketones, polyaryletherketones, transparent conductive polyesters, cycloolefin polymer, cellulose triacetate (TAC), copolymers thereof, elastomers thereof, or any combination thereof. In one embodiment, which can be combined with other embodiments, the substrate is formed of polyethylene terephthalate (PET).

The substrate 240 has a thickness TK4 within a range of about 1 microns to about 200 microns, or higher. In one or more embodiments, the thickness TK4 is within a range of 2 microns to 100 microns, such as 25 microns to 50 microns. In one or more embodiments, the substrate 240 has a phase arrangement that is a mixture of crystalline and amorphous (e.g., partly crystalline and partly amorphous). In one or more embodiments, a majority of the phase arrangement is amorphous. The phase arrangement can facilitate a flexibility for the substrate 240. The phase arrangement is facilitated, for example, by depositing each of the one or more wet hardcoat layers 251, 252, the one or more adhesion promotion layers 260, the ARF layer 270, the dry hardcoat layer 280, and the anti-smudge layer 290 at process temperature(s) that are less than a glass transition temperature of the substrate 240.

One or More Wet Hardcoat (wHC) Layers

The one or more wet hardcoat layers 251, 252 include a first wet hardcoat layer 251 having a first thickness T1 and a second wet hardcoat layer 252 having a second thickness T2. In one or more embodiments, the one or more wet hardcoat layers 251, 252 are amorphous. In one embodiment, which can be combined with other embodiments, the first thickness T1 and the second thickness T2 are substantially equal (such as within a difference of 5% or less) with respect to each other. In one embodiment, which can be combined with other embodiments, the second thickness T2 is less than the first thickness T1. In one embodiment, which can be combined with other embodiments, the second thickness T2 is greater than the first thickness T1.

In the implementation shown in FIG. 2, the second wet hardcoat layer 252 is positioned between the first wet hardcoat layer 251 and the carrier substrate 210. The implementation shown in FIG. 2 is an exemplary implementation. Other implementations are contemplated. For example, other locations along the substrate structure 205 are contemplated for the first wet hardcoat layer 251 and/or the second wet hardcoat layer 252. The present disclosure contemplates that the substrate structure 205 can include one wet hardcoat layer or three or more wet hardcoat layers.

In one or more embodiments, the one or more wet hardcoat layers 251, 252 can be a single wet hardcoat layer. Each of the one or more wet hardcoat layers 251, 252 can be or include one or more acrylates (such as urethane acrylate), one or more solgels, one or more siloxanes (such as solgel-siloxane hybrids with or without silica nanoparticles), one or more copolymers thereof, one or more elastomers thereof, or any combination thereof. The hybrid siloxane(s) may include organic and inorganic elements, including metal alkoxides. In one or more examples, each of the one or more wet hardcoat layers 251, 252 contains or is an acrylate which can be or include a radiation curable acrylate, aliphatic urethane acrylate, a copolymer thereof, an elastomer thereof, or any combination thereof. In one or more examples, each wet hardcoat layer 251, 252 includes or is a thermally-cured acrylate and/or a UV-cured acrylate.

Each wet hardcoat layer 251, 252 obtains the "wet" portion of its name due to being deposited or otherwise formed by a type of liquid deposition process which uses a liquid-type media or starting material. Once deposited or otherwise formed, each wet hardcoat layer 251, 252 is a solid layer which is completely dry or substantially dry. Each wet hardcoat layer 251, 252 can be produced from a gel, a spin-coating, a solution, a suspension, or any combination thereof. In one or more examples, the gel, solution, or suspension contains one or more solvents. In one or more examples, the gel, solution, or suspension does not contain a solvent, such as being completely or substantially free of a solvent. In one or more embodiments, each wet hardcoat layer 251, 252 can be formed, treated, and/or otherwise processed on a sheet-to-sheet processing system and/or a roll-to-roll processing system. For example, each wet hardcoat layer 251, 252 can be deposited, coated, or otherwise formed on an underlying surface, layer, or device by one or more sheet-to-sheet and/or roll-to-roll process operations.

In one or more embodiments, each wet hardcoat layer 251, 252 contains a plurality of inorganic nanoparticles or other particulate displaced or otherwise disposed within an organic matrix or an inorganic matrix. In one or more examples, each wet hardcoat layer 251, 252 contains thermally-cured or UV-cured acrylates or sol-gels with organic matrix interspersed or distributed with inorganic nano-particles, embedded as fillers or covalently bonded to the organic matrix. Exemplary inorganic particles can be or include silica, alumina, titanium oxide, zirconium oxide, hafnium oxide, or any combination thereof. The inorganic particles can be nanoparticles and have a particle size of about 1 nm to about 500 nm, about 5 nm to about 100 nm, or about 10 nm to about 50 nm. Each wet hardcoat layer 251, 252 can include about 40 wt % to about 75 wt % of the inorganic particles or other particulate.

Each wet hardcoat layer 251, 252 has a refractive index within a range of about 1.40 to about 1.55, or higher. In one or more embodiments, the refractive index is within a range of about 1.43 to about 1.51.

The first thickness T1 and the second thickness T2 can each be within a range of about 0.1 microns to about 50 microns, or higher. In one embodiment, which can be combined with other embodiments, the first thickness T1 and the second thickness T2 are each within a range of about 0.2 microns to about 40 microns, such as about 0.5 microns to about 40 microns. In one embodiment, which can be combined with other embodiments, the first thickness T1 and the second thickness T2 are each within a range of 0.2 microns to 3.0 microns.

Each wet hardcoat layer 251, 252 has a porosity within a range of about 5% to about 15%, as measured using Ellipsometry Porosity. In one or more embodiments, the porosity is within a range of about 5% to about 12%, such as within a range of about 6% to about 12%, as measured using Ellipsometry Porosity.

Each wet hardcoat layer 251, 252 can have a pencil hardness within a range of about 2H to about 9H, such as about 4H to about 9H, based on the pencil hardness scale. In one or more embodiments, each wet hardcoat layer 251, 252 has a pencil hardness within a range of about 6H to about 9H.

In one or more embodiments, each wet hardcoat layer 251, 252 has a nano-indentation hardness across a thickness of the respective wet hardcoat layer 251, 252 within a range of about 0.1 GPa to about 5 GPa, or higher, as measured by a nano-indentation technique, which follows the Oliver-Pharr Indentation methods for mechanical properties characterization of materials. In one or more embodiments, the nano-indentation hardness is about 0.5 GPa to about 1.5 GPa. In one or more embodiments, each wet hardcoat layer 251, 252 has an elastic modulus within a range of about 5 GPa to about 15 GPa (such as about 5 GPa to about 13 GPa) or higher, as measured by nano-indentation.

Each wet hardcoat layer 251, 252 has a bending inside radius of up to about 1 mm to about 5 mm; a bending outside radius of up to about 2 mm to about 20 mm, such as about 5 mm to about 20 mm; a transmittance of about 85% to about 98%, about 88% to about 95%, or about 90% to about 92% or higher; and a thermal resistance of about −20° C. to about 80° C. In one or more examples, each wet hardcoat layer 251, 252 can be cured using ultraviolet radiation, a thermal curing process, an electron-beam process and/or a vacuum deposition process with plasma. Each wet hardcoat layer 251, 252 can have a transmission of about 90% to about 99.99% ASTM D1003, a haze of less than 1% ASTM D10003 (such as 0.5% or less), and a sandpaper abrasion of less than 0.5% ASTM D1044.

One or More Adhesion Promotion Layers (APL)

The one or more adhesion promotion layers 260 can include a single layer or can include a plurality of layers. In embodiments were the adhesion promotion layer 260 contains two or more layers, the adhesion promotion layer 260 can have a consistent composition across the thickness of the layer or can have a gradient composition across the thickness. A gradient composition across the thickness provides gradient properties (e.g., hardness, elastic modulus, or carbon concentration) across the thickness of the adhesion promotion layer 260. In one or more examples, the hardness value each of the one or more adhesion promotion layers 260 is about 10% to about 15% of the elastic modulus value of the respective adhesion promotion layer 260.

Each of the one or more adhesion promotion layers 260 contains one or more materials which can be or include silicon oxide, silicon carbide, silicon oxycarbide, silicon nitride, silicon oxynitride, silicon oxycarbide nitride, a dopant thereof, or any combination thereof. The one or more adhesion promotion layers 260 can be deposited or otherwise produced by one or more vapor deposition processes which can be or include PVD, sputtering, CVD, PECVD, HDP-CVD, ALD, PE-ALD, other vacuum or vapor deposition processes, or any combination thereof. In one or more embodiments, the adhesion promotion layer 260 can be formed, treated, and/or otherwise processed on a sheet-to-sheet processing system or a roll-to-roll processing system. For example, the one or more adhesion promotion layers 260 can deposited, coated, or otherwise formed on an underlying surface, layer, or device by one or more sheet-to-sheet or roll-to-roll process operations.

In one or more examples, the one or more adhesion promotion layers 260 can be deposited or otherwise produced from one or more silicon precursors and one or more oxidizing agents during a vapor deposition process. The ratio of the silicon precursor and the oxidizing agent can be adjusted during the vapor deposition process after depositing each sublayer of a stack. These adjustments are used to control the desired gradient properties. The silicon precursor can be or include one or more alkylsilanes, alkoxysilanes, alkylsiloxanes, alkylsilazanes, or any combination thereof. The oxidizing agent can be or include oxygen, ozone, plasma oxygen, atomic oxygen, water or vapor, nitrous oxide, peroxide, or any combination thereof.

In one or more examples, the one or more adhesion promotion layers 260 include a non-gradient layer or film. In one or more examples, each of the one or more adhesion promotion layers 260 can be a gradient layer or film which contains two or more sublayers therein. For example, each of the one or more adhesion promotion layers 260 can contain 2-10 sublayers, or more sublayers.

In one or more embodiments, each of the one or more adhesion promotion layers 260 has a gradient of carbon concentration across a thickness of the respective adhesion promotion layer 260. Each of the one or more adhesion promotion layers 260 has a plurality of sublayers. Each of the one or more adhesion promotion layers 260 can include 2-12 sublayers, or more sublayers. In one or more examples, the plurality of sublayers contains a gradient of carbon concentration across a thickness of the respective adhesion promotion layer 260, and/or a gradient of hardness across a thickness of the respective adhesion promotion layer 260, and/or a gradient of elastic modulus across a thickness of the respective adhesion promotion layer 260.

In one or more examples, each of the one or more adhesion promotion layers 260 includes five sublayers of varying hardness (H) to produce a gradient across the thickness of the respective adhesion promotion layer 260. In one or more examples, the five sublayers include: $1^{st}$ layer: H=about 0.5-0.9 GPa; $2^{nd}$ layer: H=about 0.8-1.3 GPa; $3^{rd}$ layer H=about 1.2-2.4 GPa; 4th layer H=about 2.0-2.8 GPa; and $5^{th}$ layer H=about 2.0-2.9 GPa. In one or more examples, the five sublayers include: $1^{st}$ layer: H=about 0.7-0.9 GPa; $2^{nd}$ layer: H=about 1.1-1.3 GPa; $3^{rd}$ layer H=about 1.9-2.4 GPa (another example H=about 2.2-2.4 GPa); $4^{th}$ layer H=about 2.6-2.8 GPa; and 5th layer H=about 2.7-2.9 GPa.

In one or more embodiments, each of the plurality of sublayers independently have a nano-indentation hardness across a thickness of the respective adhesion promotion layer 260 within a range of about 0.1 GPa to about 5 GPa (such as about 0.4 GPa to about 5 GPa), or higher, as measured by a nano-indentation technique, which follows the Oliver-Pharr Indentation methods for mechanical properties characterization of materials. In one or more examples, each of the plurality of sublayers can independently have a nano-indentation hardness across a thickness of the respective adhesion promotion layer 260 within a range of about 0.1 GPa to about 5 GPa, as measured by a nano-indentation technique.

Each of the one or more adhesion promotion layers 260 has a refractive index within a range of about 1.35 to about 1.55, or higher. In one or more embodiments, the refractive index is within a range of about 1.40 to about 1.55, such as about 1.43 to about 1.51. In one or more embodiments, each of the one or more adhesion promotion layers 260 has a refractive index within a range of about 1.43 to about 1.150.

Each of the one or more adhesion promotion layers 260 has a thickness within a range of about 0.01 microns to about 50 microns, or higher. In one embodiment, which can be combined with other embodiments, the one or more adhesion promotion layers 260 have an overall thickness OT1 that is less than 1.2 microns. In one or more embodiments, the overall thickness OT1 is 50 nm or higher. In one or more embodiments, each of the one or more adhesion promotion layers 260 has a transmittance of 82% or more, such as about 85% to about 98%. In one or more embodiments, each of the one or more adhesion promotion layers 260 has an elastic modulus within a range of about 2.5 GPa to about 70 GPa as measured by nano-indentation.

In one or more embodiments, one or more of: the one or more wet hardcoat layers 251, 252, the adhesion promotion layer 260, the anti-reflectance layer 270, the dry hardcoat layer 280, and/or the anti-smudge layer 290 have an overall thickness OT2 (shown in FIG. 2) and/or a pencil hardness. The overall thickness OT2 can be within a range of 1 micron to 30 microns, such as 1 micron to 10 microns, or 5 microns to 10 microns. The pencil hardness is within a range of about 2H to about 9H, such as about 4H to about 9H, based on the pencil hardness scale. In one or more embodiments, the dry hardcoat layer 280 has a pencil hardness within a range of about 6H to about 9H.

Figure 4:
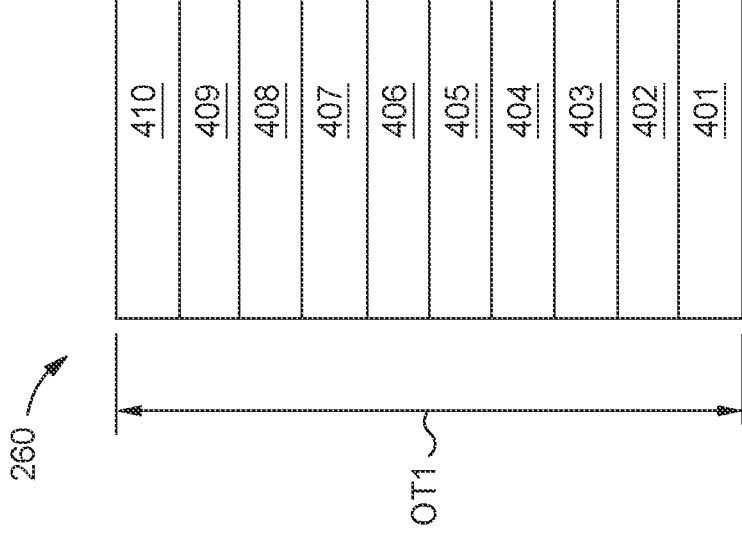
FIG. 4 depicts a schematic, cross-sectional view of an adhesion promotion layer that includes a plurality of sublayers, according to one or more implementations described herein.

FIG. 4 depicts a schematic, cross-sectional view of an adhesion promotion layer 260 that includes a plurality of sublayers 401-410, according to one or more implementations described herein. Ten sublayers 401-410 are shown in FIG. 4. In one or more embodiments, the adhesion promotion layer 260 can be used for each of the one or more adhesion promotion layers 260 in any implementation described herein. Although the adhesion promotion layer 260 is shown with ten sublayers 401-410, the adhesion promotion layer 260 can include 2-9 sublayers, or more sublayers. In one or more examples, the plurality of sublayers 401-410 contains a gradient of carbon concentration across a thickness (such as the overall thickness OT1) of the adhesion promotion layer 260 and/or a gradient of hardness across a thickness (such as the overall thickness OT1) of the adhesion promotion layer 260. The carbon concentration can vary across the thickness of the adhesion promotion layer 260 by decreasing the carbon content from the bottom or lowest layer to the top or highest layer within the plurality of sublayers.

In one or more examples of the adhesion promotion layer 260, the carbon content of the bottom or lowest layer can be about 20 atomic percent (at %) to about at % and the carbon content of the top or highest layer can be about 5 at % to about at %. In one or more examples of the adhesion promotion layer 260 containing five sublayers (Layers 1-5 from bottom to top, respectively), the plurality of sublayers include the following carbon concentrations: Layer 1 about 20 at % to about 65 at % (another example about 20 at % to about 43 at %); Layer 2 about 15 at % to about 35 at %; Layer 3 about 10 at % to about 30 at %; Layer 4 about 7 at % to about 20 at %; and Layer 5 about 5 at % to about 15 at %. The carbon content can be measured using X-ray Photoelectron Spectroscopy (XPS) elemental analysis technique.

Anti-Reflectance (ARF) Layer

The anti-reflectance layer 270 includes one or more layers for reducing or prohibiting light reflection. The anti-reflectance layer 270 includes one or more materials which can be or include silicon nitride, silicon oxynitride, silicon carbide nitride, silicon oxycarbide nitride, a dopant thereof, or any combination thereof. The anti-reflectance layer 270 can be deposited or otherwise produced from one or more vapor deposition processes. For example, the anti-reflectance layer 270 is deposited or produced from a vapor deposition process which can be or include sputtering, PVD, CVD, PECVD, HDP-CVD, ALD, PE-ALD, other vacuum or vapor deposition processes, or any combination thereof. In one or more examples, the anti-reflectance layer 270 contains silicon nitride deposited by one or more vapor deposition processes. In one or more embodiments, the anti-reflectance layer 270 can be formed, treated, and/or otherwise processed on a sheet-to-sheet processing system and/or a roll-to-roll processing system. For example, the anti-reflectance layer 270 can deposited, coated, or otherwise formed on an underlying surface, layer, or device by one or more sheet-to-sheet and/or roll-to-roll process operations.

In one or more examples, the anti-reflectance layer 270 is formed or otherwise deposited by a vapor deposition process using one or more of the following precursors: one or more organic polymer precursors (liquid and/or gas), hexameth-yldisiloxane (HMDSO), ppHMDSO, tetramethyl cyclo-tetrasiloxane (TOMCAT), hexamethyldisilazane (HMDSN), tetraethyl orthosilicate (TEOS), silane, disilane, trisilane, or any combination thereof. In one or more examples, the anti-reflectance layer 270 is formed or otherwise deposited by a sputtering process using silica or quartz.

The anti-reflectance layer 270 has a refractive index within a range of about 1.5 to about 2.5.

The anti-reflectance layer 270 has a thickness TK5 within a range of about 0.5 nm to about 250 nm, or higher. In one or more embodiments, the thickness TK5 is within a range of about 2 nm to about 250 nm, such as about 20 nm to about 250 nm, The anti-reflectance layer 270 has an optical transmission in the visible range within a range of about 82% to about 99%, such as 88% or higher, 90% or higher, or 92% or higher.

Dry Hardcoat (dHC) Layer

In one or more embodiments, one or more dry hardcoat layers can be used in addition to the dry hardcoat layer 280. The dry hardcoat layer 280 contains one or more materials which can be or include silicon oxide, silicon carbide, silicon oxycarbide, silicon nitride, silicon oxynitride, silicon oxycarbide nitride, a dopant thereof, or any combination thereof. In one or more examples, the dry hardcoat layer 280 includes carbon, and the carbon content is within a range of about 1 at % to about 20 at %. For example, the dry hardcoat layer 280 can have a carbon content of about 1 at % to about 20 at %, such as about 5 at % or higher. The carbon content can be measured using X-ray Photoelectron Spectroscopy (XPS) elemental analysis technique. In one or more embodiments, the dry hardcoat layer 280 is amorphous.

The dry hardcoat layer 280 obtains the "dry" portion of its name due to being formed by one or more types of vapor deposition processes. Once deposited or otherwise formed, the dry hardcoat layer 280 is a solid layer which is completely dry or substantially dry. The dry hardcoat layer 280 is deposited, formed, or otherwise produced from a vapor deposition process which can be or include PVD, CVD, PECVD, HDP-CVD, ALD, PE-ALD, other vacuum or vapor deposition processes, or any combination thereof. In one or more examples, the dry hardcoat layer 280 is produced, deposited, coated, or otherwise formed by a vacuum processing, atmospheric processing, solution processing, and/or other deposition or coating techniques, and then optionally treated or cured with a thermal and/or UV exposure. In one or more embodiments, the dry hardcoat layer 280 can be formed, treated, and/or otherwise processed on a sheet-to-sheet processing system and/or a roll-to-roll processing system. For example, the dry hardcoat layer 280 can deposited, coated, or otherwise formed on an underlying surface, layer, or device by one or more sheet-to-sheet and/or roll-to-roll process operations.

The dry hardcoat layer 280 has a refractive index within a range of about 1.40 to about 1.55, or higher. In one or more embodiments, the refractive index is within a range of about 1.42 to about 1.55, such as about 1.45 to about 1.51.

The dry hardcoat layer 280 has a thickness T3. The third thickness T3 can be within a range of about 0.05 microns to about 50 microns (such as about 0.05 microns to about 30 microns, or about 0.1 microns to about 30 microns), or higher. In one embodiment, which can be combined with other embodiments, the third thickness T3 is within a range of about 0.2 microns to about 40 microns, such as about 0.5 microns to about 40 microns. In one embodiment, which can be combined with other embodiments, the third thickness T3 is within a range of 0.2 microns to 3.0 microns.

The dry hardcoat layer 280 has a porosity within a range of about 0.5% to about 8%, as measured using Ellipsometry Porosity. In one or more embodiments, the dry hardcoat layer 280 has a porosity within a range of about 0.5% to less than 7%, and each wet hardcoat layer 251, 252 has a porosity within a range of about 7% to about 12%. In one or more embodiments, the dry hardcoat layer 280 has a porosity within a range of about 0.5% to less than 6%, and each wet hardcoat layer 251, 252 has a porosity within a range of about 6% to about 12%. In one or more embodiments, the dry hardcoat layer 280 has a porosity within a range of about 1% to less than 7%, and each wet hardcoat layer 251, 252 has a porosity within a range of about 7% to about 10%. In one or more embodiments, the dry hardcoat layer 280 has a porosity within a range of about 1% to less than about 6%, and each wet hardcoat layer 251, 252 has a porosity within a range of about 6% to about 10%.

The dry hardcoat layer 280 has a pencil hardness within a range of about 2H to about 9H, such as about 4H to about 9H, based on the pencil hardness scale. In one or more embodiments, the dry hardcoat layer 280 has a pencil hardness within a range of about 6H to about 9H.

In one or more embodiments, the dry hardcoat layer 280 has a nano-indentation hardness across a thickness (such as the third thickness T3) of the dry hardcoat layer 280 within a range of about 0.1 GPa to about 5 GPa, or higher, as measured by a nano-indentation technique, which follows the Oliver-Pharr Indentation methods for mechanical properties characterization of materials. In one or more embodiments, the nano-indentation hardness is within a range of about 1 GPa to about 8 GPa. In one or more embodiments, the dry hardcoat layer 280 has an elastic modulus within a range of about 5 GPa to about 70 GPa as measured by nano-indentation.

The dry hardcoat layer 280 has a bending inside radius of up to about 1 mm to about 5 mm; a bending outside radius of up to about 2 mm to about 20 mm, such as about 5 mm to about 20 mm; a transmittance of about 85% to about 98%, about 88% to about 95%, or about 90% to about 92% or higher; and a thermal resistance of about −20° C. to about 80° C. In one or more examples, the dry hardcoat layer 280 can be cured using ultraviolet radiation, an electron-beam process and/or vacuum deposition process with plasma. The dry hardcoat layer 280 can have a transmission of about 90% to about 99.99% ASTM D1003, a haze of less than 1% ASTM D10003 (such as 0.5% or less), and a sandpaper abrasion of less than 0.5% ASTM D1044.

Anti-Smudge Layer

The anti-smudge layer 290, which can be referred to as an anti-fingerprint coating (AFC) layer, includes one or more layers, films, or coatings and provides an overall upper surface for the cover lens structure 202 or other cover lens structures described herein. The anti-smudge layer 290 reduces or prohibits fingerprints, smudges, marring, and other contaminants on the outer and/or upper surfaces of the anti-smudge layer 290. The anti-smudge layer 290 contains one or more materials which can be or include a fluorosilane, a perfluoropolyether-containing silane polymer, a chlorosilane, an oxysilane, a fluoroethylene, a perfluoropolyether, a nitrogen fluoride or nitrogen-fluorine containing compound, a polymer thereof, a dopant thereof, or any combination thereof. In one or more examples, the anti-smudge layer 290 has an inorganic-organic-inorganic layer stack.

The anti-smudge layer 290 is deposited or otherwise produced by one or more deposition processes which can be or include PVD, ion beam evaporation, CVD, spin coating, spray coating, dip coating, thermal curing, or any combination thereof. In one or more embodiments, the anti-smudge layer 290 can be formed, treated, and/or otherwise processed on a sheet-to-sheet processing system and/or a roll-to-roll processing system. For example, the anti-smudge layer 290 can deposited, coated, or otherwise formed on an underlying surface, layer, or device by one or more sheet-to-sheet and/or roll-to-roll process operations.

The anti-smudge layer 290 has a surface energy within a range of about 5 dyne/cm to about 100 dyne/cm.

The anti-smudge layer 290 has a thickness TK6 within a range of about 0.5 nm to about 100 nm, or higher. In one or more embodiments, the thickness TK6 is within a range of about 1 nm to about 100 nm, such as about 3 nm to about 50 nm. In one or more embodiments, the thickness TK6 is within a range of about 1 nm to about 250 nm, such as about 50 nm to about 250 nm.

In one or more embodiments, any two, three or more of the FDS 204, the carrier substrate 210, the impact absorption layer 220, the moisture barrier layer 230, the substrate 240, the one or more wet hardcoat layers 251, 252, the one or more adhesion promotion layers 260, the anti-reflectance layer 270, the dry hardcoat layer 280, and/or the anti-smudge layer 290 can be coupled, connected, adhered, bonded, attached, or otherwise held together by one or more adhesive layers (not shown). Each adhesive layer can independently be or include one or more optically clear adhesives (OCAs) and/or pressure-sensitive adhesive (PSAs). In one or more examples, each of the adhesive layers is applied as a liquid-based adhesive which dries and bonds the two adjacent surfaces together. In some examples, each of the adhesive layers is OCA two-sided tape that bonds the two adjacent surfaces together.

In one or more embodiments, any two, three or more of the FDS 204, the carrier substrate 210, the impact absorption layer 220, the moisture barrier layer 230, the substrate 240, the one or more wet hardcoat layers 251, 252, the one or more adhesion promotion layers 260, the anti-reflectance layer 270, the dry hardcoat layer 280, and/or the anti-smudge layer 290 can be coupled, connected, adhered, bonded, attached, or otherwise held together without the use of an adhesive. As such, any or all of the adhesive layers may be excluded and the neighboring components or layers are held together with inherent bonding forces. For example, any two, three or more of the FDS 204, the carrier substrate 210, the impact absorption layer 220, the moisture barrier layer 230, the substrate 240, the one or more wet hardcoat layers 251, 252, the one or more adhesion promotion layers 260, the anti-reflectance layer 270, the dry hardcoat layer 280, and/or the anti-smudge layer 290 can be coupled, connected, adhered, bonded, attached, or otherwise held together to the neighboring layer, film, or device and no adhesive layer is at the interface therebetween. Any neighboring layer, film, or device can be deposited or otherwise formed directly onto the other neighboring layer, film, or device.

The present disclosure contemplates that display devices can include more than one cover lens structure 202 mounted to an FDS 204. As an example, the display device 200 can include a first cover lens structure 202, a second cover lens structure, and a sacrificial adhesion layer disposed between the first cover lens structure 202 and the second cover lens structure. The first cover lens structure 202 and the second cover lens structure can be identical to each other or different from each other. The first and second cover lens structures 202 can be removable and replaceable (e.g., due to being scratched or suffering other damage). The sacrificial adhesion layer can be selectively degraded, destroyed, or otherwise removed in order to separate the first cover lens structure 202 from the second cover lens structure or other display structure. The first cover lens structure 202 can be separated from the second cover lens structure by exposing the sacrificial adhesion layer to a predetermined temperature, a predetermined wavelength and/or dosage of ultraviolet (UV) light, and/or a predetermined mechanical removal mechanism. The sacrificial adhesion layer contains one or more polymeric or oligomeric materials which can be or include an acrylate, a silicone, a thermoplastic adhesive, an elastomeric adhesive, or any combination thereof. In one or more examples, the sacrificial adhesion layer includes one or more OCAs. The sacrificial adhesion layer can be or include one or more polymeric or oligomeric materials, such as one or more acrylates, silicones, thermoplastic adhesives, elastomeric adhesives, or any combination thereof. When the adhesion or bond between the first cover lens structure 202 and the second cover lens structure is broken, the first cover lens structure 202 and the second cover lens structure can be separated from each other. The sacrificial adhesion layer can be the same as, or different than, the one or more adhesion promotion layers 260.

In one or more embodiments, the first cover lens structure 202 and the second cover lens structure can independently have flexibility over repeated cycles to bend to as low as 1 mm inside radius of curvature or as low as 4 mm outside radius of curvature. In one or more embodiments, during bend operations of the display device having the cover lens structure 202, the first cover lens structure 202 can independently move relative to the second flexible cover lens assembly 2330 by slipping, shearing, and/or sliding mechanism provided by the sacrificial adhesion layer, which separates the first cover lens structure 202 from the second cover lens structure.

The first cover lens structure 202 and the second cover lens structure can independently have an impact resistance, with or without the impact absorption layers, as measured by a standard ball drop test, showing an ability to withhold up to 130 g steel ball dropped from a 100 cm height, and in one or more examples, a height of greater than 100 cm, such as 120 cm to about 150 cm. In one or more examples, the first cover lens structure 202 and the second cover lens structure can independently have a scratch resistance as measured by a standard steel wool test loaded up to 1 kg and able to withstand a large number of cycles, for example, about 100 cycles to about 4,000 cycles, such as about 2,00 cycles.

The first cover lens structure 202 and the second cover lens structure can independently have a total transmission of about 85% to about 95% or higher, such as 88% or higher, 90% or higher, or 92% or higher. The first cover lens structure 202 and the second cover lens structure can independently have a haze of about 1% or less (such as 0.5% or less), a yellow index of B*<1, and a high fracture toughness. The first cover lens structure 202 and the second cover lens structure can independently have a bending inside radius of up to about 1 mm to about 5 mm; and a bending outside radius of up to about 2 mm to about 20 mm, such as about 5 mm to about 20 mm. The first cover lens structure 202 and the second cover lens structure can independently have a change in haze after a steel wool abrasion test that is less than 1%. The first cover lens structure 202 and the second cover lens structure can independently have a change in haze after a Taber abrasion resistance test (e.g., loaded up to 1 kg with the cover lens structures withstanding about 100 cycles or more) that is less than 2%.

FIG. 3 is a schematic block diagram view of a method 300 of forming a cover lens structure, according to one implementation.

Operation 302 includes mounting a substrate structure to a carrier substrate. The substrate structure includes a substrate and one or more wet hardcoat layers. In one embodiment, which can be combined with other embodiments, the one or more wet hardcoat layers are omitted. In one embodiment, which can be combined with other embodiments, the substrate is a polymeric layer. In one embodiment, which can be combined with other embodiments, the substrate is formed of PET. In one embodiment, which can be combined with other embodiments, the carrier substrate is formed of glass.

Operation 304 includes positioning the substrate structure and the carrier substrate in a processing chamber. The carrier substrate and the substrate structure mounted thereto are positioned on a susceptor that is positioned at a predetermined distance from a gas diffuser.

Operation 305 includes activating an electrostatic chuck of the susceptor to chuck the carrier substrate to the susceptor.

Operation 306 includes igniting a plasma. In one or more embodiments, the plasma is ignited in an internal volume of the processing chamber.

Operation 307 includes conducting a plasma treatment operation on the substrate structure. The plasma treatment operation includes: a process pressure within a range of 300 mTorr to 1000 mTorr; a radio-frequency (RF) power density within a range of 0.007 W/cm² to 0.07 W/cm²; an oxidizer flow rate within a range of 100 SCCM to 2000 SCCM; an argon (Ar) flow rate within a range of 500 (standard cubic centimeters per minute (SCCM) to 10000 SCCM; and the predetermined distance being within a range of 500 mil to 2000 mil.

Operation 309 includes depositing one or more adhesion promotion layers above at least one of the one or more wet hardcoat layers.

Operation 311 includes depositing a dry hardcoat layer above the one or more adhesion promotion layers using a dry deposition process that includes plasma enhanced chemical vapor deposition (PECVD). In one embodiment, which can be combined with other embodiments, the dry deposition process including PECVD is used to also deposit the one or more adhesion promotion layers at operation 2704. In such an embodiment, different process gases can be used to deposit one or more adhesion promotion layers and a dry hardcoat layer that are formed of differing materials. The dry deposition process of the dry hardcoat layer includes exposing the substrate structure to one or more reactive gases for an exposure time that is less than 12.0 minutes. In one embodiment, which can be combined with other embodiments, the one or more adhesion promotion layers (of operation 2709) and the dry hardcoat layer (of operation 2711) are deposited while the plasma (ignited at operation 2706) is still ignited. Precursor gases used in operation 311 may include organic polymer precursors (liquid or gas) with carbon, such as one or more of hexamethyldisiloxane (HMDSO), plasmapolymerized HMDSO (ppHMDSO), tetramethyl cyclotetrasiloxane (TOMCAT), hexamethyldisilazane (HMDSN), and/or tetraethyl orthosilicate (TEOS).

The dry deposition process includes: a process pressure within a range of 300 mTorr to 1000 mTorr; a radio-frequency (RF) power density within a range of 0.07 W/cm² to 0.6 W/cm²; an oxidizer-to-organosilane gas ratio within a range of 5.0 to 100.0; an argon (Ar) flow rate within a range of 500 (standard cubic centimeters per minute (SCCM) to 10000 SCCM; and the predetermined distance being within a range of 500 mil to 2000 mil.

Optional operation 313 includes depositing an anti-smudge layer above the dry hardcoat layer. Operation 2713 can be conducted in the processing chamber, or in a separate chamber that is different than the processing chamber.

Each of the one or more adhesion promotion layers, the dry hardcoat layer, and the anti-smudge layer is deposited at a process temperature that is less than a glass transition temperature of the substrate. The process temperature is less than degrees Celsius. In one embodiment, which can be combined with other embodiments, the process temperature is within a range of 58 degrees Celsius to 77 degrees Celsius, such as within a range of 60 degrees Celsius to 75 degrees Celsius. In one or more embodiments, the process temperatures is 75 degrees Celsius or less, such as 70 degrees Celsius or less. In one or more embodiments, the process temperature is at least 5 degrees Celsius lower than the glass transition temperature of the substrate. In one or more embodiments, the process temperature is at least 10 degrees Celsius (e.g., 10 degrees Celsius or more) lower than the glass transition temperature of the substrate. In one or more embodiments, any operation involving forming at least part of (such as one or more layers of) the cover lens structure is conducted at a process temperature that is less than a glass transition temperature of the substrate. Such processing operations can include but are not limited to deposition operations (such as coating operations), curing operations, and/or baking operations. In one or more embodiments, the glass transition temperature is 80 degrees Celsius. In one or more embodiments, the glass transition temperature is less than 80 degrees Celsius, such as 77 degrees Celsius or less (for example 75 degrees Celsius or less). The present disclosure contemplates that the glass transition temperature can be higher than 80 degrees Celsius.

Operation 315 includes spacing the carrier substrate and the substrate structure mounted thereto from the susceptor.

Operation 317 includes removing the carrier substrate and the substrate structure mounted thereto from the processing chamber. The processing chamber is an RF-PECVD chamber that includes a remote plasma source control (RPSC) device for cleaning interior surfaces of the RF-PECVD chamber. After operation 317, a cleaning plasma can be used to clean the interior surfaces of the processing chamber. For example, the cleaning plasma can be supplied to the internal volume using an RPS of the RPSC device.

The present disclosure contemplates that the carrier substrate can be mounted to a flexible display structure (FDS) when positioned in the processing chamber at operation 304, or the carrier substrate (and the substrate structure mounted thereto), can be mounted to the FDS after operation 317.

Figure 5:
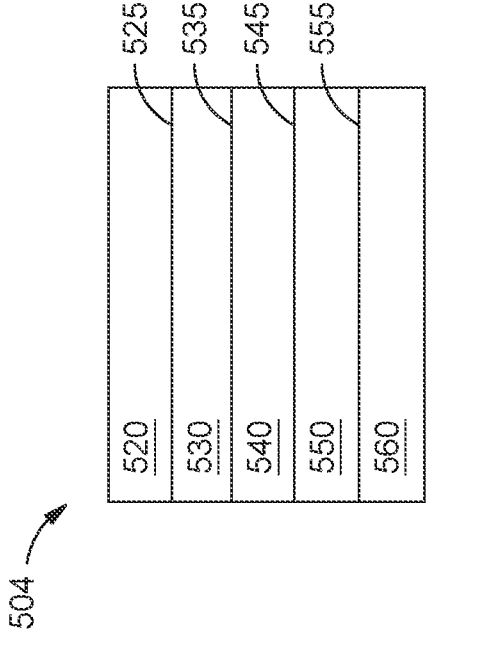
FIG. 5 shows a schematic, cross-sectional view of a flexible display structure that can be used as the flexible display structure of the display device, according to one or more implementations described herein.

FIG. 5 shows a schematic, cross-sectional view of a flexible display structure 504 that can be used as the flexible display structure 204 of the display device 200, according to one or more implementations described herein. The flexible display structure 204, 504 can be or include a flexible display, a rigid display, or other device and can be contained within a monitor, a display, a screen, a television, a phone (e.g., mobile phone, smart phone, or cellular phone), a computer or laptop, a tablet, a watch, or other electronic device. In one or more examples, the flexible display structure 504 includes a contrast enhancing layer or a polarizer layer 520, a touch panel 530, a display layer 540, a substrate 550, and a backing film 560. The polarizer layer 520 is or includes a multi-function film layer containing a polarizer film. The polarizer layer 520 is used to reduce unwanted reflections due to the reflective metal that makes up the electrode lines or metallic structures within the flexible display structure 504. The polarizer layer 520 can include a quarter-wave retarder and a linear polarizer formed from flexible lens film with a thickness of less than 0.2 mm.

The touch panel 530 can include a touch sensor IC board and a touch sensor (not shown). In one or more examples, the touch sensor IC board is a flexible and metal based printed circuit board. The display layer 540 can be or include one or more light emitting diode (LED) displays, one or more liquid crystal displays (LCDs), or other suitable display devices. In one or more examples, the display layer 540 is an organic light emitting diode (OLED) display. In some examples, the display layer 540 is a quantum dot (QD) display. In one or more examples, the display layer 540 may include a thin film encapsulation (TFE), an organic emitting layer, a driver IC board, and/or a thin film transistor (TFT).

The substrate 550 can be or include a flexible plastic or polymeric substrate. The substrate 550 can be transparent and/or colorless and in one or more examples, can be conductive. The substrate 550 can be or include one or more polyimide materials, polyester terephthalates, polyether ether ketones, transparent conductive polyesters, polycarbonates, polyaryletherketones, or any combination thereof. The backing film 560 can be or include one or more heat sink layers and/or one or more protective barrier layers. In one or more examples, the substrate 550 can be similar to the substrate 240 described above, and can include one or more of the same aspects, features, components, operations, and/or properties thereof.

Each of the components of the flexible display structure 204, 504 can be adhered, bonded, or otherwise held together by one or more adhesives. For example, the polarizer layer 520 and the touch panel 530 are bonded together by an adhesive layer 525 disposed therebetween. The touch panel 530 and the display layer 540 are bonded together by an adhesive layer 535 disposed therebetween. The display layer 540 and the substrate 550 are bonded together by an adhesive layer 545 disposed therebetween. The substrate 550 and the backing film 560 are bonded together by an adhesive layer 555 disposed therebetween. Each of the adhesive layers 525, 535, 545, 555 can independently be or include one or more OCA. In one or more examples, each of the adhesive layers 525, 535, 545, 555 is applied as a liquid-based adhesive which dries and bonds the two adjacent surfaces together. In one or more examples, each of the adhesive layers 525, 535, 545, 555 is OCA two-sided tape that bonds the two adjacent surfaces together. In one or more embodiments, each of the adhesive layers 525, 535, 545, 555 is independently not disposed between their respective neighboring layers which are held together by other bonding ways. For example, any of the layers or components within the flexible display structure 204, 504 can be deposited or otherwise formed onto the neighboring layer or component.

The cover lens structure 202, the flexible display structures 204, 504, and/or any layers, films, or coating thereof, can be manufactured using chemical vapor deposition (CVD), plasma-enhanced CVD (PECVD), atomic layer deposition (ALD), plasma-enhanced ALD (PE-ALD), physical vapor deposition (PVD) or sputtering, thermal evaporation, electron beam evaporation, sheet-to-sheet processing, roll-to-roll processing, photo-lithography, etching, other film coating and curing processes, and/or other such suitable manufacturing process(es). Suitable manufacturing devices may be used from Applied Materials, Inc. of Santa Clara, CA.

The cover lens structure 202, the flexible display structures 204, 504, and/or any layers, films, or coating thereof, can have a critical strain of greater than 1%, such as within a range of about 1.5% to about 15%, or greater than 1% to about 15%, or higher. Critical strain is measured using an Ultimate Tensile Testing Machine with a prescribed elongation of the cover lens structure or other layered stack. The maximum tensile elongation survived by the cover lens structure or other layered stack without crack failure is defined as the critical strain of the cover lens structure or other layered stack.

The cover lens structures described herein may be used in any type of display device. The flexible cover lens and the flexible cover lens assemblies have strong mechanical properties (such as hardness and impact resistance), abrasion resistance, flexibility, elasticity, optical transmission, wear resistance, and/or thermostability. The cover lens structures described herein also have low hazing, low oligomer migration (such as within and from the substrate 240) and low yellow indices. The present disclosure facilitates modularity in use of substrate materials by facilitating the benefits described herein for temperature-sensitive substrates.

In one or more embodiments, the foldable cover lens structures, as described herein, have enough flexibility to sustain repeated bend cycles (such as 2,000 cycles or more), with each cycle folding the flexible cover lens structure to a radius of curvature of 5 mm or less. Other radii of curvature are contemplated. In terms of critical strain, the flexibility of the cover lens can be indicated by the critical strain the cover lens is able to withstand, with greater than 1% critical strain in one or more embodiments. Other critical strain values are contemplated.

By utilizing a sacrificial adhesion layer containing degradable optically clear adhesive between a first flexible cover lens and a second flexible cover lens, or between a first flexible cover lens and a display structure or display device, if damage occurs, the first flexible cover lens can easily be removed (and replaced with a new cover lens) without damage to the underlying structures or devices.

The benefits described are facilitates by the present disclosure (such as features of the display device 200 and the method 300). As an example, depositing various layers at a process temperature that is less than a glass transition temperature of the substrate 240 facilitates lower oligomer migration in and from the substrate, lower hazing, lower yellow indices, and enhanced optical transmission (and optical device performance) at relatively strong mechanical properties.

It is contemplated that aspects described herein can be combined. For example, one or more features, aspects, components, operations, and/or properties of the processing chamber 100, the display device 200, the method 300, the one or more adhesion promotion layers 260, and/or the flexible display structure 504 can be combined. It is further contemplated that any combination(s) can achieve the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method of forming a cover lens structure, comprising:
    positioning a substrate structure and a carrier substrate in a processing chamber, wherein the substrate structure is mounted to the carrier substrate, and the substrate structure comprises a substrate and one or more wet hardcoat layers;
    depositing one or more adhesion promotion layers above at least one of the one or more wet hardcoat layers;
    depositing a dry hardcoat layer above the one or more adhesion promotion layers using a dry deposition process that includes plasma enhanced chemical vapor deposition (PECVD), the dry deposition process of the dry hardcoat layer comprising:
        exposing the substrate structure to one or more reactive gases for a total exposure time that is less than 12.0 minutes,
        an oxidizer-to-organosilane gas ratio within a range of 5.0 to 100.0, and
        a first radio-frequency (RF) power density within a range of 0.07 $W/cm^2$ to 0.6 $W/cm^2$;
    depositing an anti-smudge layer above the dry hardcoat layer,
    wherein each of the one or more adhesion promotion layers, the dry hardcoat layer, and the anti-smudge layer is deposited at a process temperature that is less than 80 degrees Celsius, wherein the process temperature is less than a glass transition temperature of the substrate; and
    conducting a plasma treatment operation on the substrate structure, the plasma treatment operation comprising:
        applying a second RF power density that is less than the first RF power density.

2. The method of claim 1, wherein the substrate is formed of one or more polymeric materials.

3. The method of claim 2, wherein the substrate is formed of polyethylene terephthalate (PET).

4. The method of claim 1, wherein each of the one or more wet hardcoat layers has a thickness that is within a range of 0.2 microns to 3.0 microns.

5. The method of claim 4, wherein the one or more wet hardcoat layers comprise a first wet hardcoat layer having a first thickness and a second wet hardcoat layer having a second thickness.

6. The method of claim 5, wherein the first thickness is substantially equal to the second thickness.

7. The method of claim 5, wherein the second wet hardcoat layer is positioned between the first wet hardcoat layer and the carrier substrate, and the second thickness is less than the first thickness.

8. The method of claim 1, wherein the dry hardcoat layer has a thickness that is within a range of 0.2 microns to 3.0 microns.

9. The method of claim 1, wherein the one or more adhesion promotion layers have an overall thickness that is less than 1.2 microns.

10. The method of claim 1, wherein the one or more adhesion promotion layers are deposited using the dry deposition process that includes PECVD.

11. The method of claim 10, wherein the carrier substrate and the substrate structure mounted thereto are positioned on a susceptor that is positioned at a predetermined distance from a gas diffuser.

12. The method of claim 11, further comprising, prior to the deposition of the one or more adhesion promotion layers:
    activating an electrostatic chuck of the susceptor to chuck the carrier substrate; and
    igniting a plasma.

13. The method of claim 12, wherein the one or more adhesion promotion layers and the dry hardcoat layer are deposited while the plasma is still ignited.

14. The method of claim 13, wherein the dry deposition process further comprises:
    a process pressure within a range of 300 mTorr to 1000 mTorr;
    an argon (Ar) flow rate within a range of 500 (standard cubic centimeters per minute (SCCM) to 10000 SCCM; and
    the predetermined distance being within a range of 500 mil to 2000 mil.

15. The method of claim 14, wherein the second RF power density is within a range of 0.007 $W/cm^2$ to 0.07 $W/cm^2$, and the plasma treatment operation comprises:
    a process pressure within a range of 300 mTorr to 1000 mTorr;
    an oxidizer flow rate within a range of 100 SCCM to 2000 SCCM;
    an argon (Ar) flow rate within a range of 500 (standard cubic centimeters per minute (SCCM) to 10000 SCCM; and
    the predetermined distance being within a range of 500 mil to 2000 mil.

16. The method of claim 1, wherein the process temperature is within a range of 58 degrees Celsius to 77 degrees Celsius.

17. The method of claim 16, wherein the process temperature is within a range of 60 degrees Celsius to 75 degrees Celsius.

18. A method of forming a cover lens structure, comprising:
    positioning a substrate structure and a carrier substrate in a processing chamber, wherein the substrate structure is mounted to the carrier substrate, and the substrate structure comprises a substrate and one or more wet hardcoat layers;
    depositing one or more adhesion promotion layers above at least one of the one or more wet hardcoat layers;
    depositing a dry hardcoat layer above the one or more adhesion promotion layers using a dry deposition process that includes plasma enhanced chemical vapor deposition (PECVD), the dry deposition process of the dry hardcoat layer comprising:
        exposing the substrate structure to one or more reactive gases for a total exposure time that is less than 12.0 minutes, the one or more reactive gases having an oxidizer-to-organosilane gas ratio within a range of 5.0 to 100.0, and applying a first radio-frequency (RF) power density;

depositing an anti-smudge layer above the dry hardcoat layer, wherein each of the one or more adhesion promotion layers, the dry hardcoat layer, and the anti-smudge layer is deposited at a process temperature that is less than 80 degrees Celsius; and conducting a plasma treatment operation on the substrate structure, the plasma treatment operation comprising:

applying a second RF power density that is less than the first RF power density.

19. The method of claim 18, wherein each of the one or more wet hardcoat layers has a thickness that is within a range of 0.2 microns to 3.0 microns.

20. The method of claim 18, wherein the dry hardcoat layer has a thickness that is within a range of 0.2 microns to 3.0 microns.

* * * * *